US011475863B2

(12) United States Patent
Chen et al.

(10) Patent No.: US 11,475,863 B2
(45) Date of Patent: Oct. 18, 2022

(54) DISPLAY DRIVING DEVICE AND ANTI-INTERFERENCE METHOD THEREOF

(71) Applicant: HIMAX TECHNOLOGIES LIMITED, Tainan (TW)

(72) Inventors: Peng-Chi Chen, Tainan (TW); Mong-Hua Tu, Tainan (TW); Chih-Hsiang Lin, Tainan (TW)

(73) Assignee: HIMAX TECHNOLOGIES LIMITED, Tainan (TW)

(*) Notice: Subject to any disclaimer, the term of this patent is extended or adjusted under 35 U.S.C. 154(b) by 0 days.

(21) Appl. No.: 16/894,858

(22) Filed: Jun. 7, 2020

(65) Prior Publication Data
US 2021/0383770 A1 Dec. 9, 2021

(51) Int. Cl.
G09G 5/00 (2006.01)
G09G 3/36 (2006.01)
H03L 7/08 (2006.01)
H03L 7/06 (2006.01)
G09G 3/20 (2006.01)

(52) U.S. Cl.
CPC ........... G09G 5/008 (2013.01); *G09G 3/2096* (2013.01); *G09G 3/3685* (2013.01); *G09G 5/006* (2013.01); *G09G 2330/06* (2013.01); *G09G 2330/12* (2013.01); *G09G 2370/08* (2013.01); *H03L 7/06* (2013.01); *H03L 7/0807* (2013.01)

(58) Field of Classification Search
CPC ............... G09G 5/008; G09G 2370/08; G09G 2330/06; G09G 3/3685; G09G 2330/12; G09G 3/2096; G09G 5/006; H03L 7/06; H03L 7/0807
See application file for complete search history.

(56) References Cited

U.S. PATENT DOCUMENTS

| | | | |
|---|---|---|---|
| 9,406,282 B2 * | 8/2016 | Gomez | G09G 3/006 |
| 2013/0113777 A1 * | 5/2013 | Baek | G09G 5/008 |
| | | | 345/212 |
| 2015/0103038 A1 * | 4/2015 | Han | G06F 3/0443 |
| | | | 345/98 |
| 2020/0265766 A1 * | 8/2020 | Huang | G09G 3/20 |
| 2021/0020136 A1 * | 1/2021 | Zhao | G09G 3/36 |
| 2021/0201757 A1 * | 7/2021 | Kim | H01Q 9/0421 |

FOREIGN PATENT DOCUMENTS

| | | |
|---|---|---|
| TW | I567705 | 1/2017 |
| TW | 201933328 | 8/2019 |

OTHER PUBLICATIONS

"Office Action of Taiwan Counterpart Application", dated Jan. 7, 2021, p. 1-p. 5.

* cited by examiner

Primary Examiner — Douglas M Wilson
(74) Attorney, Agent, or Firm — JCIPRNET

(57) ABSTRACT

A display driving device and an anti-interference method thereof are provided. A timing controller outputs a data signal. A source driver detects an interference event according to the data signal, and outputs a feedback signal to the timing controller in response to the detection result of the interference event. The timing controller adjusts the signal strength of the data signal according to the feedback signal.

8 Claims, 3 Drawing Sheets

DISPLAY DRIVING DEVICE AND ANTI-INTERFERENCE METHOD THEREOF

BACKGROUND

Technical Field

The present invention relates to a driving device, and in particular to a display driving device and an anti-interference method thereof.

Description of Related Art

When a mobile phone (or other radio frequency (RF) device) is close to a display device, RF noise may cause the display screen of the display device to be abnormal.

Further, a timing controller transmits a data signal to a source driving circuit via a transmission line, and the source driving circuit drives a display panel to display an image according to the data signal. When the mobile phone is close to the display device, RF noise of the mobile phone may interfere with the transmission of the data signal between the timing controller and the source driving circuit. When the energy of the RF noise in the data signal is large enough, the source driver circuit may not latch the data signal correctly.

SUMMARY

The present invention provides a display driving device and an anti-interference method thereof, which can effectively prevent the display driving device from being unable to drive the display device to display a correct picture due to the interference of RF noise.

The display driving device of the present invention includes a timing controller and a source driver. The timing controller outputs a data signal. The source driver is coupled to the timing controller, and detects an interference event based on the data signal, and outputs a feedback signal to the timing controller in response to the detection result of the interference event. The timing controller adjusts the signal strength of the data signal according to the feedback signal.

In an exemplary embodiment, when the source driver detects the interference event, the timing controller increases the signal strength of the data signal according to the feedback signal.

In an exemplary embodiment, the source driver includes a clock data recovery circuit which receives a data signal and performs a phase-locking operation on the data signal. The source driver determines whether an interference event occurs based on a result of locking the data signal by the clock data recovery circuit.

In an exemplary embodiment, the source driver determines that the interference event occurs when the phase-locking operation of the data signal by the clock data recovery circuit enters a loss-of-lock state.

In an exemplary embodiment, the feedback signal is a hardware pin signal or a differential signal.

In the present invention, the anti-interference method for the display driving device includes the following steps: outputting a data signal to a source driver, detecting an interference event based on data signals and generating a feedback signal based on a detection result of the interference event by the source driver, and adjusting the signal strength of the data signal according to the feedback signal.

In an exemplary embodiment, the anti-interference method further includes: increasing the signal strength of the data signal according to the feedback signal when the source driver detects the interference event.

In an exemplary embodiment, the anti-interference method further includes, by the source driver, performing a phase-locking operation on the data signal and determining whether the interference event occurs based on a result of locking the data signal by the clock data recovery circuit.

In an exemplary embodiment, the anti-interference method further includes determining, by the source driver, that the interference event occurs when the phase lock operation on the data signal enters a loss-of-lock state.

In an exemplary embodiment, the feedback signal is a hardware pin signal or a differential signal.

Based on the above, the source driver according to the exemplary embodiment of the present invention can detect whether an interference event occurs according to the clock embedded data signal output by the timing controller, and provide a feedback signal to the timing controller based on the detection result. The timing controller can adjust the signal strength of the clock embedded data signal according to the feedback signal, thereby avoiding that the display driving device cannot drive the display device to display the correct picture due to the interference of RF noise.

In order to make the above features and advantages of the present invention more comprehensible, embodiments are described below in detail with the accompanying drawings as follows.

DESCRIPTION OF THE EMBODIMENTS

Figure 1:
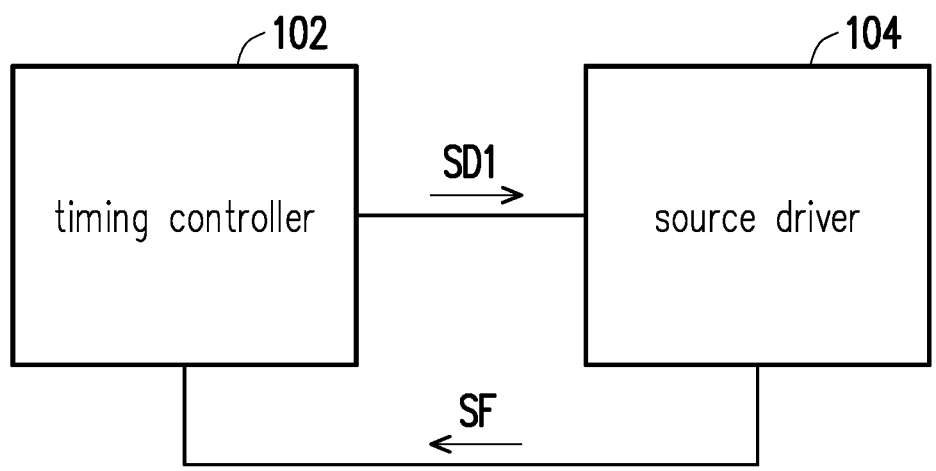
FIG. 1 is a schematic diagram of a display driving device according to an exemplary embodiment of the present invention.

FIG. 1 is a schematic diagram of a display driving device according to an exemplary embodiment of the present invention. Referring to FIG. 1, The display driving device may include a timing controller 102 and a source driver 104. The timing controller 102 is coupled to the source driver 104. The timing controller 102 may output a data signal SD1 to the source driver 104, and the source driver 104 may detect whether an interference event occurs according to the data signal SD1. For example, the interference even includes that the data signal is interfered by radio frequency noise (RF noise) and the phase is changed. The source driver 104 may output a feedback signal SF to the timing controller 102 according to the result of detecting the interference event, such that the timing controller 102 adjusts the signal strength of the data signal SD1 according to the feedback signal SF.

Figure 2:
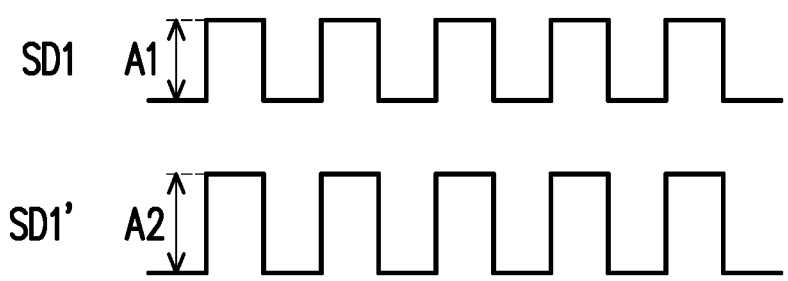
FIG. 2 is a waveform diagram of a data signal according to an exemplary embodiment of the present invention.

For example, as shown in the waveform diagram of the data signal in FIG. 2, when the source driver 104 detects the occurrence of the interference event, the timing controller 102 may increase the original amplitude A1 of the data signal SD1 according to the feedback signal SF provided by the source driver 104, and output the data signal SD1 having a larger amplitude (A2) to the source driver 104. Because the data signal SD1 having the larger amplitude will have better anti-interference to RF noise, the source driver 104 may drive the display panel to correctly display a picture according to the data signal SD1, thereby avoiding an abnormal displaying.

In addition, since the interference event does not occur during the electromagnetic interference (EMI) test, the timing controller 102 of the present exemplary embodiment does not increases the signal strength of the data signal SD1 during the EMI test, that is, the display driving device does not emit excessive radiation energy and thus the EMI test can be passed. And, during electromagnetic safety (EMS) test, the signal strength of the data signal SD1 is increased in response to the interference events (for example, radio frequency noise (RF noise) interference) and thus the electromagnetic endurance test can be passed. Therefore, the display driving device of the present exemplary embodiment can be beneficial to the passing of product verification.

Figure 3:
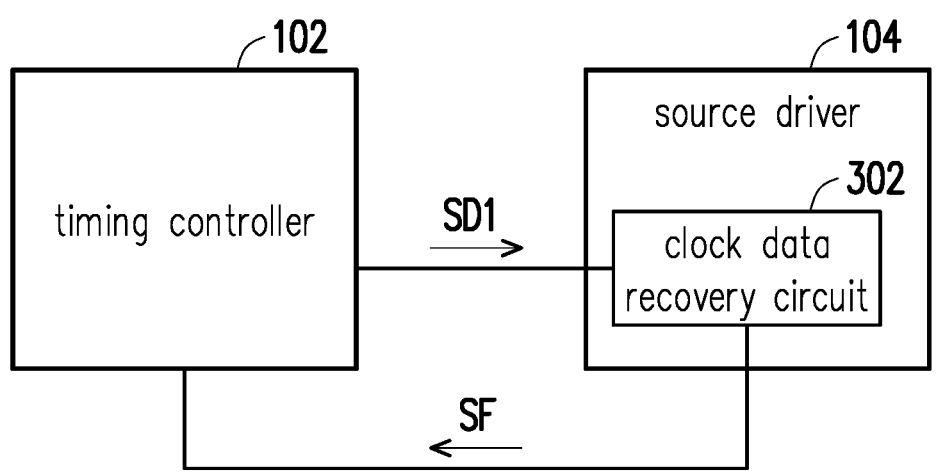
FIG. 3 is a schematic diagram of a display driving device according to another exemplary embodiment of the present invention.

FIG. 3 is a schematic diagram of a display driving device according to another exemplary embodiment of the present invention. Further, the source driver 104 may include a clock data recovery circuit 302, and the clock data recovery circuit 302 is coupled to the timing controller 102. The clock data recovery circuit 302 may receive the data signal SD1 and perform a phase-locking operation on the data signal SD1. The source driver 104 may determine whether an interference even occurs according to a result of the phase-locking operation performed on the data signal SD1 by the clock data recovery circuit 302.

In detail, the clock data recovery circuit 302 may output a feedback signal SF to the timing controller 102 to notify the timing controller 102 that an interference even occurs when the phase-locking operation on the data signal SD1 is in a loss-of-lock state, such that the timing controller 102 increases the signal strength of the data signal SD1. For example, the feedback signal SF may be a hardware pin signal, and the clock data recovery circuit 302 may output a feedback signal SF having a low voltage level when the phase of the data signal SD1 is the same as the phase of the clock signal of the clock data recovery circuit 302, and output a feedback signal SF having a high-voltage level when the phase of the data signal SD1 and the phase of the clock signal of the clock data recovery circuit 302 are different. In this way, when the data signal SD1 is affected by RF noises and the phase of the data signal SD1 is different from the phase of the clock signal of the clock data recovery circuit 302, the timing controller 102 is notified to increase the signal strength of the data signal SD1 to prevent the phase of data signal SD1 from changing due to the interference generated by the RF noise.

Since the timing controller 102 of the present exemplary embodiment may directly increase the signal strength of the data signal SD1 according to the feedback signal SF when an interference event occurs, the clock data recovery circuit 302 may quickly re-lock the data signal SD1 after the signal strength is increased. In the conventional technology, when the phase-locking operation enters the loss-of-lock state, the timing controller provides training data to the clock data recovery circuit for clock training, so that an abnormal displaying occurs during training. Compared with the conventional technology, the display driving device of the present exemplary embodiment can quickly make the clock data recovery circuit 302 to lock the correct frequency, thereby effectively avoiding an abnormal displaying.

It is worth noting that, in some exemplary embodiments, the feedback signal SF may also be, for example, a differential signal having a first-end signal and a second-end signal. For example, when the first-end signal and the second-end signal are mutually inverted, it represents that no interference event occurs, and when the first-end signal and the second-end signal are in phase with each other, it represents that an interference event occurs.

Figure 4:
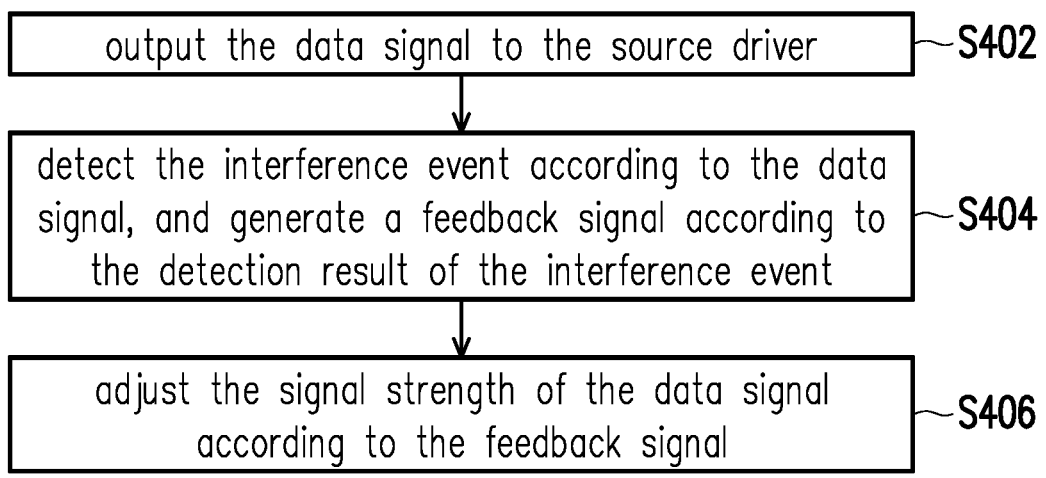
FIG. 4 is a flowchart of an anti-interference method for a display driving device according to an exemplary embodiment of the present invention.

FIG. 4 is a flowchart of an anti-interference method for a display driving device according to an exemplary embodiment of the present invention. It can be known from the above exemplary embodiments that the anti-interference method for the display driving device may include the following steps. First, the data signal is outputted to the source driver (step S402). Then, the source driver detects the interference event according to the data signal, and generates a feedback signal according to the detection result of the interference event (step S404). For example, the source driver may perform a phase-lock operation on the data signal and determine whether an interference event occurs based on a result of locking the data signal by the clock data recovery circuit. Then, the signal strength of the data signal is adjusted according to the feedback signal (step S406). For example, when the source driver detects an interference event, the signal strength of the data signal may be increased according to the feedback signal to avoid the phase of the data signal from changing due to the interference generated by RF noises. The feedback signal may be, for example, a hardware pin signal or a differential signal.

In summary, the source driver of the present invention can detect whether an interference event occurs based on the clock embedded data signal output by the timing controller, and provide a feedback signal to the timing controller based on the detection result. The timing controller can adjust the signal strength of the clock embedded data signal according to the feedback signal, thereby avoiding that the display driving device cannot drive the display device to display the correct picture due to the interference generated by RF noises. In addition, since the timing controller of the present invention increases the signal strength of the data signal only when an interference event occurs, the display driving device can easily pass the electromagnetic interference test and the electromagnetic safety test.

Although the present invention has been disclosed as above by way of example, it is not intended to limit the present invention. Any person with ordinary knowledge in the technical field can make some changes and decorations without departing from the spirit and scope of the present invention. Therefore, the scope of protection of the present invention shall be determined by the scope of the attached patent applications.

What is claimed is:

1. A display driving device, comprising:
a timing controller, configured to output a data signal; and
a source driver, coupled to the timing controller, and configured to detect an interference event according to the data signal and output a feedback signal to the timing controller in response to a detection result of the interference event,
wherein the timing controller adjusts a signal strength of the data signal according to the feedback signal,
wherein the source driver comprises:
a clock data recovery circuit, configured to receive the data signal and perform a phase lock operation on the data signal,
wherein the source driver determines whether the interference event occurs according to a result of locking the data signal by the clock data recovery circuit,
wherein the clock data recovery circuit output the feedback signal having a low voltage level when a phase of the data signal is the same as a phase of a clock signal of the clock data recovery circuit, and output the feedback signal having a high-voltage level when the phase of the data signal and the phase of the clock signal of the clock data recovery circuit are different,
wherein the timing controller does not increase the signal strength of the data signal when the display driving device operates in an electromagnetic interference test, the timing controller responds to interference event to increases the signal strength of the data signal when the display driving device operates in an electromagnetic safety test.

2. The display driving device according to claim 1, wherein when the source driver detects the interference event, the timing controller increases the signal strength of the data signal according to the feedback signal.

3. The display driving device according to claim 1, wherein when the phase lock operation performed by the clock data recovery circuit on the data signal enters a loss-of-lock state, the source driver determines that the interference event occurs.

4. The display driving device according to claim 1, wherein the feedback signal is a hardware pin signal or a differential signal.

5. An anti-interference method for a display driving device, comprising:
  outputting a data signal to a source driver;
  detecting, by the source driver, an interference event according to the data signal and generating a feedback signal according to a detection result of the interference event;
  adjusting the signal strength of the data signal according to the feedback signal; and
  performing, by the source driver, a phase lock operation on the data signal; and
  determining whether the interference event occurs according to a result of locking the data signal,
  wherein when a phase of the data signal is the same as a phase of a clock signal of a clock data recovery circuit, the feedback signal having a low voltage level is output by the clock data recovery circuit, and when the phase of the data signal and the phase of the clock signal of the clock data recovery circuit are different, the feedback signal having a high-voltage level is output by the clock data recovery circuit,
  wherein the display driving device does not increase the signal strength of the data signal when the display driving device operates in an electromagnetic interference test, the display driving device responds to interference event to increases the signal strength of the data signal when the display driving device operates in an electromagnetic safety test.

6. The anti-interference method according to claim 5, further comprising increasing the signal strength of the data signal according to the feedback signal wherein when the source driver detects the interference event.

7. The anti-interference method according to claim 5, further comprising:
  determining, by the source driver, that the interference event occurs when the phase-lock operation of the data signal enters a loss-of-lock state.

8. The anti-interference method according to claim 5, wherein the feedback signal is a hardware pin signal or a differential signal.

* * * * *